(12) United States Patent
Janssen et al.

(10) Patent No.: US 10,073,148 B2
(45) Date of Patent: Sep. 11, 2018

(54) FAULT DETECTION IN ENERGY SUPPLY NETWORKS

(75) Inventors: Pierre Janssen, Brussels (BE); Jean-Claude Maun, Brussels (BE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 896 days.

(21) Appl. No.: 14/411,215

(22) PCT Filed: Jun. 26, 2012

(86) PCT No.: PCT/EP2012/062314
§ 371 (c)(1),
(2), (4) Date: May 14, 2015

(87) PCT Pub. No.: WO2014/000769
PCT Pub. Date: Jan. 3, 2014

(65) Prior Publication Data
US 2015/0346286 A1 Dec. 3, 2015

(51) Int. Cl.
*H02J 3/00* (2006.01)
*G01R 31/40* (2014.01)
(Continued)

(52) U.S. Cl.
CPC ............. *G01R 31/40* (2013.01); *H02H 3/006* (2013.01); *H02H 7/261* (2013.01); *H02J 3/00* (2013.01);
(Continued)

(58) Field of Classification Search
CPC ........ H02J 3/00; H02J 2003/007; H02J 13/00; H02J 13/001; H02J 4/00; Y02E 60/74;
(Continued)

(56) References Cited

U.S. PATENT DOCUMENTS

| 5,929,642 A | 7/1999 | Philippot et al. |
| 6,518,768 B1 | 2/2003 | Philippot et al. |

(Continued)

FOREIGN PATENT DOCUMENTS

| CN | 101132130 A | 2/2008 |
| CN | 101873007 A | 10/2010 |

OTHER PUBLICATIONS

Michael Hurtgen et all. "Comparison of measurement placement algorithms for state estimation based on theoretic and eigenvector centrality procedures", 16th PSCC, Glasgow, Scotland, Jul. 14-18, 2008.*

(Continued)

*Primary Examiner* — Huan Tran
(74) *Attorney, Agent, or Firm* — Laurence Greenberg; Werner Stemer; Ralph Locher

(57) ABSTRACT

A method for detecting a fault in an energy supply network. State values are determined for a plurality of measuring points. The state values, which specify an electrical state of the energy supply network at the respective measuring point, are transmitted to a control center. The state values are used by an evaluation device for detecting a fault in the energy supply network. In order to detect errors in energy supply networks with low short-circuit currents with high reliability and selectivity, the evaluation device performs a state estimation, using a model description of the supply network suitable for describing possible electrical states of the energy supply network on the basis of state variables. The estimation examines whether an electrical state at least approximately matches the respective state values, can be described by the model description. If such a state is lacking, the evaluation device generates an fault detection signal.

20 Claims, 3 Drawing Sheets

(51) Int. Cl.
*H02H 7/26* (2006.01)
*H02H 3/00* (2006.01)
*H02S 50/10* (2014.01)
*H02J 13/00* (2006.01)

(52) U.S. Cl.
CPC ........... *H02S 50/10* (2014.12); *H02J 13/0006* (2013.01); *H02J 2003/007* (2013.01); *Y02E 60/725* (2013.01); *Y02E 60/74* (2013.01); *Y02E 60/76* (2013.01); *Y04S 10/20* (2013.01); *Y04S 10/30* (2013.01); *Y04S 40/22* (2013.01)

(58) Field of Classification Search
CPC ........ Y04S 10/30; Y04S 10/265; Y04S 10/20; Y04S 10/40; G01R 19/2513
See application file for complete search history.

(56) References Cited

U.S. PATENT DOCUMENTS

| | | | |
|---|---|---|---|
| 6,985,784 B2 | 1/2006 | Vandevanter et al. | |
| 7,069,159 B2 * | 6/2006 | Zima | H02H 7/22 702/57 |
| 2004/0207207 A1 * | 10/2004 | Stahlkopf | H02J 3/32 290/44 |
| 2012/0022713 A1 * | 1/2012 | Deaver, Sr. | G05B 17/02 700/298 |

OTHER PUBLICATIONS

Shiroei, M. et al., "A New algorithm for Fault Location on Transmission Lines", 2009, IEEE, pp. 1-5.
Beiza, J. et al, "Fault Type Estimation in Power Systems", Iranian Journal of Electrical & Electronic Engineering, vol. 5, No. 3, Sep. 2009, pp. 185-195.
Abur et al: "Power System State Estimation", 2004, New York.
Lu et al: "Distribution System State Estimation"; IEEE Transactions of Power Systems; vol. 10, pp. 229-240, XP-000513239; Feb. 1, 1995; Piscataway, New Jersey.
Hurtgen et al: "Advantages of Power System State Estimation Using Phasor Measurement Units"; 16th PSCC Proceedings of the Power Systems Computation Conference; XP-55040448; Jul. 18, 2008.
Saha et al: "Fault Location on Power Networks"; 2010; London, United Kingdom.
Hurtgen et al: "Measurement Placement Algorithms for State Estimation when the Number of Phasor Measurements by each PMU is Limited"; Universities Power Conference; XP-031348950; Sep. 1, 2008, Piscataway, New Jersey.
China Machine Press, "Distribution Network Automation Technology", edited by Guo Moufa, Mar. 2012, pp. 140-143—English translation.

* cited by examiner

FAULT DETECTION IN ENERGY SUPPLY NETWORKS

BACKGROUND OF THE INVENTION

Field of the Invention

The invention described hereinbelow was developed within the framework of a collaboration project between Siemens AG and the Faculty of Applied Sciences Bio-, Electro- and Mechanical Systems of the Free University of Brussels ULB (Université Libre de Bruxelles) under the direction of Professor Maun.

The invention relates to a method for detecting a fault in an electrical energy supply network, wherein state values are determined for a plurality of measuring points in the energy supply network, which state values indicate an electrical state of the energy supply network that is present at the respective measuring point; the state values are transmitted to a centralized control center device which comprises an evaluation device; and the state values are used by the evaluation device for the purpose of detecting a fault that is present in the energy supply network. The invention also relates to a control center device for detecting a fault in an electrical energy supply network comprising an evaluation device for acquiring state values ascertained for a plurality of measuring points in the energy supply network, which state values indicate an electrical state of the energy supply network that is present at the respective measuring point, and which evaluation device is configured for detecting a fault present in the energy supply network on the basis of the state values.

Electrical energy supply networks are typically monitored on a section-by-section basis for faults such as short-circuits or ground leakage faults, for example, by means of what are termed protection devices. In the event of such an impermissible operating state occurring, the protection devices isolate the part of the energy supply network affected by the fault from the rest of the network by opening corresponding circuit breakers and thereby avoid exposing persons and components of the electrical energy supply network to risk. In order to monitor the individual sections of the electrical energy supply network, the protection devices execute what are termed protection algorithms. This entails making use of measured values, which may be measured values characterizing for example the current and the voltage at a measuring point of the electrical energy supply network, in order to decide whether an impermissible or a permissible operating state is present.

U.S. Pat. No. 6,518,768 B1, for example, describes a system comprising a plurality of differential protection devices for monitoring a line section having a plurality of ends with regard to the occurrence of faults.

Meanwhile there are also efforts directed at consolidating protection evaluation for an energy supply network on a centralized basis. It is known from U.S. Pat. No. 6,985,784 B2, for example, to transmit measured values recorded at a plurality of measuring points in an energy supply network to a centralized control system. The described centralized control system constitutes a computer arrangement by means of which the protection algorithms typically executed in the individual decentralized protection devices are executed under central control using the transmitted measured values. When a fault is detected, a corresponding trip signal is transmitted to a switch which isolates the affected network section from the rest of the energy supply network.

Since a plurality of protection devices are in effect operated on a computer arrangement by means of the centralized control system, the result is a comparatively high investment of time and effort in the configuration, commissioning and parameterization of the centralized control system.

In today's energy supply networks comprising a large number of decentralized infeeds of electrical energy, for example by means of photovoltaic or wind power plants, there is the additional problem that due to the inverter-controlled infeed only relatively low short-circuit currents are available, i.e. even when a fault is present in the energy supply network the increase in the short-circuit current is comparatively weak, thus making detection by means of the known protection algorithms more difficult. This problem exists in particular in so-called "microgrids", i.e. small, self-contained energy supply networks, and autonomous off-grid networks, but is also to be observed in larger-scale, complex energy supply networks having an increasing proportion of electrical energy fed in from regenerative sources.

BRIEF SUMMARY OF THE INVENTION

The object underlying the present invention is to develop a method or a control center device of the type cited in the introduction in such a way that faults that occur, in particular also in energy supply networks having low short-circuit currents, can be detected with a high degree of reliability and selectivity.

In order to achieve this object with regard to the method, a method of the type cited in the introduction is proposed in which the evaluation device is used to perform a state estimation which makes use of a model description of the electrical energy supply network that is suitable for describing possible electrical states of the energy supply network on the basis of state variables, a check is carried out during the state estimation to determine whether the model description allows an electrical state of the energy supply network to be described which, in respect of the state variables used for the respective measuring points, is at least approximately in agreement with the respective state values, and in the absence of such a state the evaluation device generates a fault detection signal which indicates the presence of a fault in the energy supply network.

In this regard the method according to the invention makes use in a novel way of the mode of operation of a "state estimator", as it is referred to in the relevant technical terminology.

In a state estimation, an electrical state of an energy supply network is essentially ascertained on the basis of state values for a plurality of measuring points of the energy supply network that are as far as possible present redundantly. The difficulty here is that normally state values are not known for all possible points in the energy supply network, for example because for reasons of cost only a limited number of measurement sensors are installed. In the conventional operation of a state estimator, a maximally accurate mathematical model of the energy supply network under consideration is therefore implemented by means of the state estimator and said model can be used to determine the network state at all possible points of the energy supply network on the basis of the state values available for the measuring points present, which state values may be present e.g. in the form of currents, voltages or power capacities. Such a state is composed mathematically of a vector of state variables which indicate for example the voltage at all points of the energy supply network under consideration. Further state variables may be for example a change in a phase difference in the case of non-synchronized measurement devices, the branch currents and the setting of transformer tap changers. Conventional state estimators therefore serve for monitoring and visualizing the operating states of energy supply networks and are typically used in network control centers. Sensor faults of the measurement devices recording the state values can also be detected by means of a state estimator.

State estimators for monitoring energy transmission networks are known for example from the publication by A. Abur and A. Gomez Exposito titled "Power System State Estimation", New York: Marcel Dekker, 2004. The possibility of employing state estimators also for three-phase distribution networks is furthermore described for example in the publication by C. Lu, J. Teng and W.-H. E. Liu titled "Distribution system state estimation", IEEE Transactions on Power Systems, pp. 229-240, 1995. The use of so-called "phasor measurement units" as measurement devices for acquiring state values for a state estimator is also described in the article by Michael Hürtgen titled "Advantages of power system state estimation using Phasor Measurement Units", Proceedings of the Power Systems Computation Conference, 2008.

The invention now employs a state estimator in a novel manner for detecting a fault in an energy supply network by checking whether the model description can be used to map a state of the energy supply network which can be largely brought into agreement with the acquired state values. If this is the case, the energy supply network is deemed to be fault-free and accordingly no fault detection signal is generated. If, on the other hand, the state values cannot be brought into agreement with a state of the energy supply network which can be described by the model description, it can be inferred that a fault is present in the energy supply network and consequently the fault detection signal will be generated.

The fault detection method according to the invention can advantageously be used as primary protection, but in particular as system-wide centralized backup protection alongside existing decentralized protection devices. Furthermore, an offline fault analysis can also be carried out using stored state values.

An advantageous embodiment variant of the method according to the invention provides that the state estimation by means of the evaluation device is performed for a delimited protection zone of the energy supply network; a check is carried out during the state estimation to determine whether it is possible, by means of the model description, to describe an electrical state of the protection zone which, in respect of the state variables used for the respective measuring points lying in the protection zone, at least approximately agrees with the respective state values; and in the absence of such a state the fault detection signal is generated by the evaluation device in the form of a fault zone signal which indicates the presence of a fault in the protection zone.

With this embodiment variant a local state estimation, as it were, is carried out for one (or more) individual protection zone(s) of the energy supply network. On the basis of the result of the state estimation it is possible to infer directly whether the monitored protection zone is affected by a fault.

In this connection it can be provided that if the fault zone signal is present for the protection zone affected by the fault, values for currents and voltages that are present at one or more ends of the protection zone are determined and by means of the values for currents and voltages thus determined, for example from the state estimations determined for the sound parts of the energy supply network, a calculation is performed to identify that location within the protection zone at which the fault occurred.

In this way accurate fault localization can be performed within the monitored protection zone. An indication concerning currents and voltages present at the boundaries or ends of the protection zone can be given on the basis of the model description of the energy supply network and the state variables for fault-free subsections of the energy supply network outside of the protection zone in question. The precise fault location can be derived from these values with the aid of per se known fault location algorithms; in this case currents and voltages from one end or multiple ends of the protection zone can be used for the fault localization. Examples of fault location methods can be found for example in U.S. Pat. No. 5,929,642 or in the article by M. M. Saha, J. Izykowski and E. Rosolowski titled "Fault Location on Power Networks", 2010, London, Springer Publishing House.

A repair and maintenance management system can advantageously be supported by means of such accurate fault localization; moreover the fault localization can also be called upon for other protection purposes—in a similar manner as in the case of a distance protection device.

In principle, therefore, a two-stage method is executed up to the point of fault localization: Firstly, the presence of a fault is continuously investigated for the protection zone in question using the state estimator. Should a fault have been detected, then the actual fault location can subsequently be deduced by calculating the currents and voltages at the boundaries of the fault-affected section using the model description employed in the state estimator and the determined state variables for sound network parts outside of the protection zone under consideration by means of a conventional fault location method.

According to an alternative advantageous embodiment variant of the inventive method it is provided that in the event of the fault detection signal being present, the energy supply network is subdivided into a plurality of logical subsections, a check is carried out for individual subsections or combinations of subsections by means of a state estimation to determine whether an electrical state of the energy supply network can be described for the respective subsection or the combination of subsections by means of the model description, which state agrees in respect of the state variables used for the respective measuring points at least approximately with the respective state values, and in the absence of such a state in respect of a specific subsection or a combination of subsections the evaluation device generates a fault zone signal which indicates that subsection of the energy supply network in which the fault was detected.

With this embodiment variant it is also possible, for a complex energy supply network without separately monitored protection zones, to carry out an identification of the network part affected by the fault in addition to the mere determination of whether a fault is present in the energy supply network. For that purpose the state estimator algorithm is applied to parts of the energy supply network so that it can be deduced from a comparison of the results of said check which subsection of the energy supply network is affected by the fault.

In this case the subsections under consideration must be self-contained and possess a redundancy of the state values acquired in respect of their measuring points. The state estimator algorithm can also be applied in this case to combinations of subsections as long as it is ensured that an individual fault-affected subsection can be reliably identified by means of a comparison of a plurality of considered subsections and/or combinations of subsections.

When a subsection has been detected as affected by the fault, a corresponding fault zone signal is generated which indicates the section in question. When the method according to the invention is used for primary or backup protection of the energy supply network, the fault zone signal can be used for tripping corresponding switching devices (e.g. circuit breakers).

According to a further advantageous embodiment variant it can also be provided that if the fault zone signal is present for the subsection of the energy supply network affected by the fault, values present for currents and voltages at one or more ends of the subsection are determined and by means of the thus determined values for currents and voltages a calculation is performed to identify that location within the subsection at which the fault occurred.

In this way accurate fault localization can be performed within the identified subsection of the energy supply network. On the basis of the model description of the energy supply network and the state variables determined during the fault detection and fault zone identification for the fault-free subsections of the energy supply network an indication can be given concerning currents and voltages present at the boundaries or ends of the subsection affected by the fault. The exact fault location can be deduced from these values with the aid of per se known fault location algorithms; in this case currents and voltages from one end or more ends of the subsection can be used for the fault localization. Examples of fault location methods can be found for example in U.S. Pat. No. 5,929,642 or in the article by M. M. Saha, J. Izykowski and E. Rosolowski titled "Fault Location on Power Networks", 2010, London, Springer Publishing House.

A repair and maintenance management system can advantageously be supported by means of such accurate fault localization.

In principle, therefore, in the case of this embodiment variant a multi-stage method is executed up to the point of fault localization: Firstly, the general presence of a fault is continuously investigated in respect of the entire energy supply network using the state estimator. Should a fault have been detected, then an identification of the subsection affected by the fault is conducted by applying the state estimator to individual subsections or combinations of subsections. By calculating the currents and voltages at the boundaries of the fault-affected section using the model description employed in the state estimator and the previously determined state variables for the sound network parts, the actual fault location can subsequently be deduced by means of a conventional fault location method.

According to an advantageous development of the inventive method it can furthermore be provided that in order to check whether an electrical state of the energy supply network which in respect of the state variables used for the respective measuring points can be described by means of the model description at least approximately agrees with the respective state values, a minimization of a cost function of states of the energy supply network which can be described by means of the model description is performed by means of the evaluation device, and an absence of a describable state is inferred if the result of the cost function lies above a selectable threshold value.

By minimizing the cost function it is possible to determine, from all of the possible state variables, that set of state variables by means of which the state values actually present can be mapped by means of the model description.

In actuality it can be provided in this connection that the matrix equation $$J=[z-h(x)]^T R^{-1}[z-h(x)]$$

is used as the cost function, where
J: is the cost function
z: is the vector of the state values determined for the measuring points;
x: is the vector of the state variables
h(x): is the vector of the state equations for the model description of the energy supply network;
R: is the covariance matrix of the vector z);
T: stands for the transposition of the affected matrix;
$^{-1}$: stands for the inversion of the affected matrix.

This equation is minimized for a three-phase system and yields a set or vector of state variables x by means of which the state values can be mapped with sufficient accuracy in the model description. In other words, the cost function is minimized via the variables x. Toward that end the result J of the cost function is compared with a threshold value; as long as the threshold value is undershot, a fault-free state can be assumed.

In order to increase the reliability of the result yielded by the state estimator even further, it can be provided in this connection, according to another development of the inventive method, that in addition a test value LNR is determined by the evaluation device for a respective vector $\hat{x}$ of the state variables emerging as result from the minimization of the cost function, according to $$LNR = \max_i \frac{|z_i - h_i(\hat{x})|}{std(z_i - h(\hat{x}))}$$

where the index i stands for the state of the model description described in each case by means of the i-th component of the measurement function h(x), i.e. the vector of the state equations of the model description of the energy supply system, and an absence of a describable state is inferred when the test value exceeds a selectable test threshold value. In this case the checks according to the cost function J and the test value LNR (Largest Normalized Residual) can be logically combined by ANDing or ORing, i.e. according to the setting of the protection system a fault can be detected when one of the two checks identifies or both checks identify a fault.

The state values are typically acquired by means of measurement sensors arranged at respective measuring points in the energy supply network. Such measured state values are regarded as most reliable state values and can be weighted correspondingly more heavily in the state estimation method.

Furthermore it can also be provided that at least some of the state values for specific measuring points are calculated or estimated.

In this case state values are determined on the basis of the measured state values using models (e.g. load models) and/or network parameters (e.g. line impedances) for those measuring points in the energy supply network at which no measured state variables are present, e.g. due to non-existent or defective sensors. Such calculated state values are regarded as less reliable than the measured state values and can therefore be included with a lower weighting in the state estimation.

The set of measured values must furthermore enable the state variables to be determined. If, for example, no voltage measurement is taken, it is not possible to ascertain the state of the system. If the network is not "observable", the method cannot be used for the protection zone in question; or more models must be available.

With regard to the control center device, the aforesaid object is achieved by means of a control center device of the type cited in the introduction, which device is configured for performing a method as claimed.

To sum up, it can be stated that the method according to the invention or, as the case may be, the evaluation device according to the invention discloses a novel possibility for fault detection in energy supply networks in that it is checked by means of a state estimator whether model description and state values match one another. Since this is the case only in a fault-free state of the energy supply network, it can be reliably detected in this way whether a fault is present in the energy supply network or not. If the state estimation is performed directly for a self-contained protection zone, the part of the network affected by the fault can be determined immediately. Otherwise the actual fault-affected subsection can be identified in a corresponding manner by application of the state estimator to individual subsections of the energy supply network. A precise fault localization can finally take place also with the aid of the values for currents and voltages at the boundaries of the fault-affected section resulting for the fault-free subsections from the model description.

BRIEF DESCRIPTION OF THE SEVERAL VIEWS OF THE DRAWING

The invention is explained in more detail below with reference to an exemplary embodiment. In the figures.

DESCRIPTION OF THE INVENTION

Figure 1:
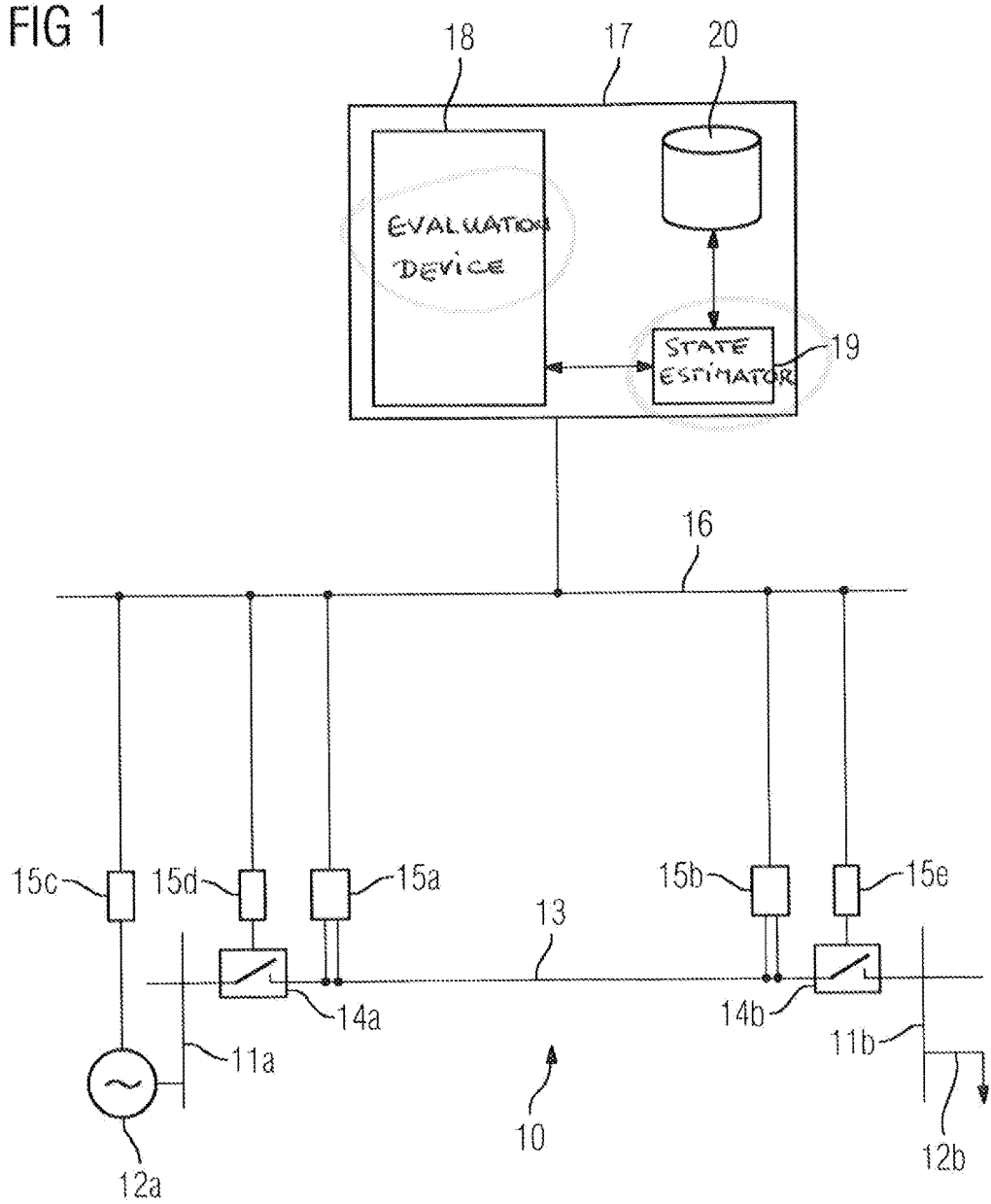
FIG. 1 shows a schematic view of an energy supply network monitored by means of a control center device.

FIG. 1 shows in a schematic representation an electrical energy supply network 10, indicated merely by way of example, which has a source 12a at a first busbar 11a and a load 12b at a second busbar 11b. The two busbars 11a and 11b are connected to each other by way of an energy supply line 13. The energy supply line 13 can be isolated from the busbars 11a and 11b via switching devices 14a and 14b. Additionally provided in the region of the switching devices 14a and 14b are measurement or protection devices in the form of IEDs (Intelligent Electronic Devices) 15a and 15b, which record state values in the form of current phasors and/or voltage phasors at their measuring points of the energy supply network 10. Further IEDs 15c, 15d and 15e are also provided; the IED 15c measures a state value in the form of a current phasor indicating the infeed by means of the source 12a, while the IEDs 15d and 15e are connected to the switching devices 14a and 14b and acquire state values there in the form of switch positions (open/closed). Simple amplitude measurements can also be processed instead of current and/or voltage phasors.

All of the state values acquired in this way are transmitted by way of communication links to a communication bus 16, which is in turn connected to a control center device 17, e.g. a SCADA (Supervisory Control and Data Acquisition) system, and transfers the state values to said system.

The control center device 17 comprises an evaluation device 18, which can be for example a microprocessor-controlled data processing device equipped with special control center software. The evaluation device 18 is connected to a state estimator module ("state estimator") 19, which in turn possesses access to a database 20 in which information is stored relating to the energy supply network 10, e.g. topology data concerning the layout of the energy supply network 10, technical properties such as line admittances, parameters for load models and switching states of the switching devices (e.g. the switching devices 14a, 14b) of the energy supply network 10. This information can be dynamically adapted to fit current operating states of the energy supply network, e.g. in that stored switching states are corrected to match the actual switch positions. The information stored in the database 20 is used by the state estimator module 19 for generating and operating a model description by means of which the energy supply network 10 is also mapped mathematically.

In order to detect a fault, e.g. a short-circuit or ground leakage fault, in the energy supply network 10, the evaluation device 18 is configured to compare the state values acquired by measurement at the measuring points in the energy supply network and, where appropriate, calculated state values which have been determined e.g. from the measured state values or using load models for the electrical load 12b with state variables ascertained by the state estimator module which are possible for fault-free operation of the energy supply network 10. State variables, in this context, are typically voltage phasors ascertained by means of the model description for the respective measuring points of the energy supply network. These, where appropriate after conversion using state equations, can be compared with the state values ascertained (by measurement or calculation) for the individual measuring points. Provided the state estimator module can be used to map an operating state of the energy supply network by means of such state variables, which are to a large extent in agreement with the ascertained state values, the energy supply network is regarded as fault-free; otherwise the presence of a fault can be inferred. In other words, it is checked with the method whether the mathematical description of the energy supply network 10 and the actual state of the energy supply network 10 described by means of the state values are in agreement. Since the model description is suitable solely for describing fault-free states of the energy supply network 10, a fault-affected state of the energy supply network 10 may be inferred from a lack of agreement or an inadequate agreement.

If the state estimation is performed for one (or more) self-contained protection zone(s), detection of the presence of a fault is automatically also a pointer to that part of the energy supply network 10 in which the fault is present. In this embodiment variant the fault detection signal is therefore generated in the form of a fault zone signal which indicates the affected protection zone.

If, on the other hand, the fault detection is performed on the basis of the state estimation for the entire energy supply network 10, it is not possible to make an assertion about the location of the fault in the energy supply network 10, i.e. the fault-affected subsection of the energy supply network 10, even when the evaluation device 18 has detected the presence of a fault in the energy supply network 10. This indication is, however, required for determining those switching devices which must be tripped in order to isolate the fault. For this reason the fault detection is usually followed by a fault zone detection, during which the subsection of the energy supply network 10 actually affected by the fault is identified. For this purpose the energy supply network 10 is subdivided into a plurality of logical subsections which are checked separately for the presence of the fault. During this process effectively the same approach is adopted as in the case of the fault detection: A check is carried out—this time for the subsection in question—on the basis of the state values present for said subsection to determine whether a state which can be described by means of that part of the model description which is valid for the subsection in question can be found whose state variables are in sufficient agreement with the state values. If such a set or vector of state variables can be found, the subsection under consideration is regarded as fault-free. Since measuring points for which state values can be ascertained are frequently not available in sufficient quantity for each subsection, this method can also be performed for combinations of subsections. This shall be explained taking a simple example: Let an assumed energy supply network consist of three subsections A, B and C, wherein no measuring points for which state values can be ascertained (by measurement or calculation) exist in the subsection B. If a fault is now detected by means of the described method within the combination of the subsections A and B and if, on the other hand, a fault-free state is identified for the subsection A, then it is possible by logically combining said two results to conclude that the fault must lie within the subsection B, so that the latter can be isolated.

If a fault is detected for a subsection of the energy supply network 10, a fault zone signal characterizing the subsection affected by the fault will be generated by the evaluation device 18.

In order to rectify the fault, for which purpose—unless it is a self-extinguishing fault—a repair team will normally be necessary, the exact fault location within the affected subsection must be specified. For this purpose use is made of those current and voltage values which are ascertained by means of the model description at the boundaries or ends of the fault-affected protection zone or, as the case may be, of the fault-affected subsection. Toward that end currents and voltages in the region bordering the fault-affected protection zone or fault-affected subsection are calculated for the fault-free protection zones or subsections adjacent to the fault-affected protection zone or fault-affected subsection. This can also take place when no measuring points are present at the boundaries in question, since by virtue of the model description an operating state of the energy supply network matching the acquired state values can be described completely—and consequently also at the required boundaries. As soon as the required currents and voltages have been determined, a conventional fault location method can be employed for ascertaining the actual fault location. In this case recourse can be made to a unilateral fault location method if currents and voltages can be determined only for one end of the fault-affected protection zone or the fault-affected subsection (e.g. if the protection zone in question or subsection in question adjoins a further protection zone or a further subsection on one side only); if, on the other hand, currents and voltages are present for both ends, then it is also possible to apply a bilateral fault location method.

In this way the exact fault location can be specified, such that the repair team can be supported in tracking down and rectifying the fault.

Figure 2:
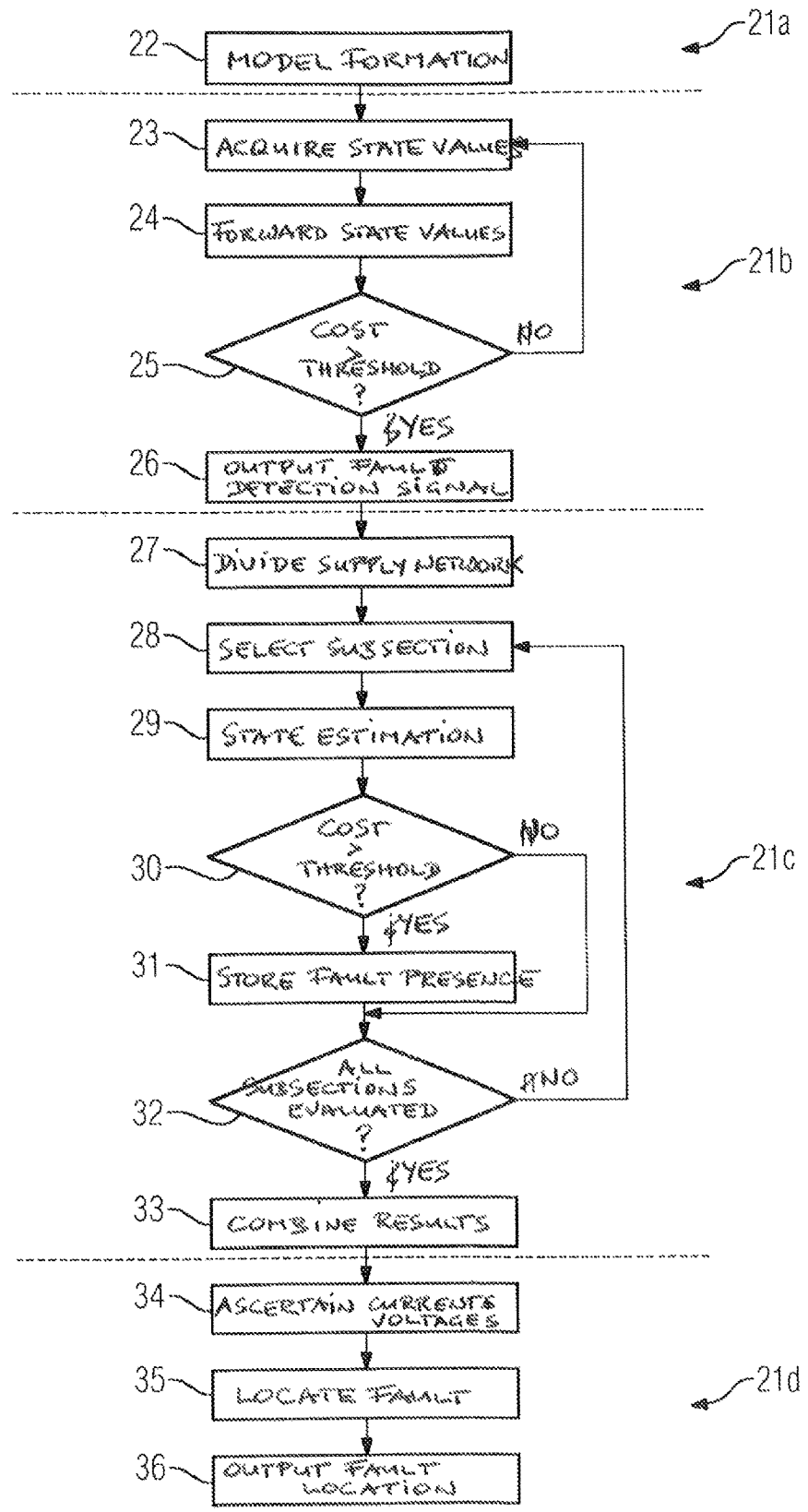
FIG. 2 is a schematic representation of a method execution sequence for detecting and localizing a fault in an energy supply network.
Figure 3:
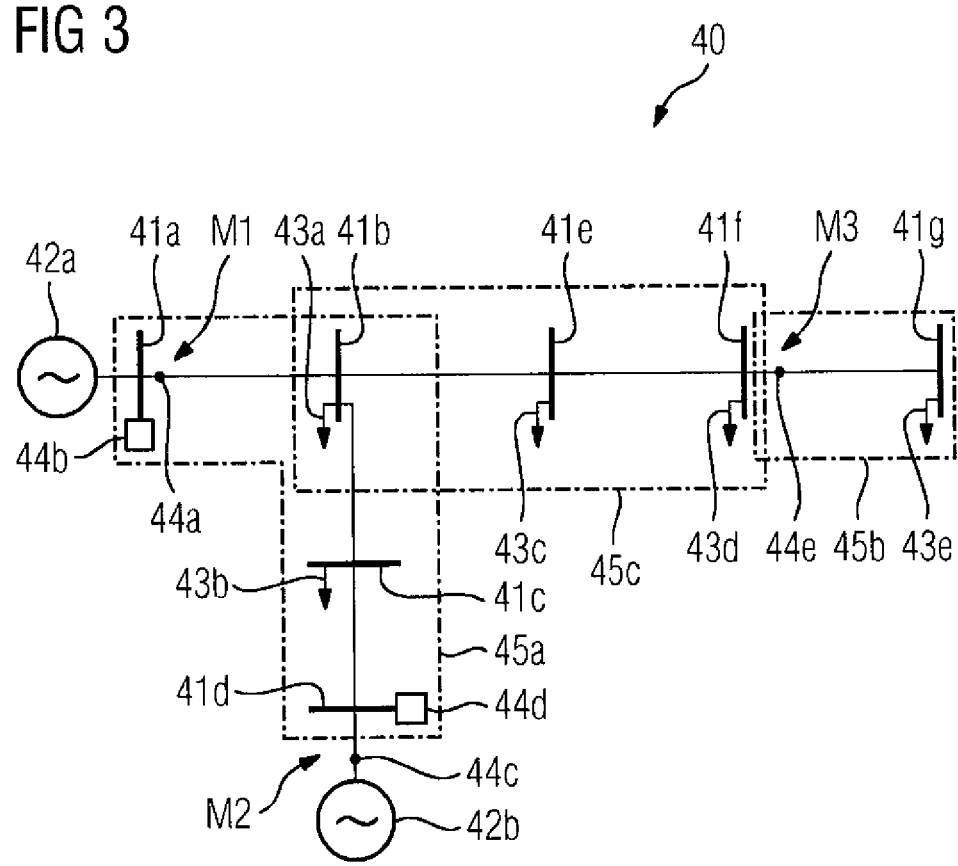
FIG. 3 shows an exemplary embodiment of an energy supply network intended to clarify the method execution sequence shown in FIG. 2.

An exemplary embodiment of a method for fault detection by means of a state estimation for the entire energy supply network shall be explained in more detail hereinbelow with reference to FIGS. 2 and 3. Fault zone identification and fault localization will also be dealt with in this case. In this context FIG. 3 shows a comparatively simply constructed energy supply network 40 comprising a plurality of network nodes 41a-41g, two infeeding sources 42a, 42b, and loads 43a-43e. FIG. 2 shows a flowchart of the method execution sequence for fault detection, fault zone identification and fault localization.

In this case the method execution sequence is divided into four main phases: an initialization phase 21a, a fault detection phase 21b, a fault zone identification phase 21c, and a fault localization phase 21d. The individual phases are visually separated from one another in the flowchart by means of dashed lines.

In the initialization phase 21a, the model description for the energy supply network 40, on which model description the state estimation is based, is generated in a model-forming step 22. To that end an admittance matrix for the lines of the energy supply network 40 is determined e.g. on the basis of topology data and electrical characteristic values for the energy supply network 40. In addition, load models for all or selected loads 43a-43e of the energy supply network 40 are defined and—insofar as necessary—other primary components, such as e.g. transformers, are modeled. The generated model description comprises a set of state equations by means of which values comparable with the state values can be determined from state variables. The initialization phase 21a is usually performed prior to the commissioning of the evaluation device 18 (cf. FIG. 1) and also as and when necessary—e.g. due to topology changes following switching operations or changes to the network structure.

During the following fault detection phase 21b, the energy supply network 40 is monitored for the presence of faults, e.g. short-circuits or ground leakage faults. To that end, in a step 23, state values are acquired for measuring points present in the energy supply network 40. In the exemplary embodiment according to FIG. 3, three measuring points exist: At measuring point M1, current phasor measured values which indicate the current flowing from network node 41a to network node 41b are acquired by means of a current measuring device 44a, and voltage phasor measured values which indicate the voltage present at network node 41a are acquired by means of a voltage measuring device 44b. At measuring point M2, current phasor measured values which indicate the current fed in at network node 41d by means of source 42b are acquired in an analogous manner by means of a current measuring device 44c, and voltage phasor measured values which indicate the voltage present at network node 41d are acquired by means of a voltage measuring device 44d. In addition, at measuring point M3, current phasor measured values which indicate the current flowing from network node 41f to network node 41g are acquired by means of a current measuring device 44e. The measuring devices 44a-44e can preferably be phasor measuring devices, referred to as PMUs ("Phasor Measurement Units"), which record time-stamped current or voltage phasors.

Should some state values not be present as current or voltage phasors or not be available for certain measuring points, state values can, at least in part, also be derived from other measured values present or be calculated with the aid of further models (e.g. load models for the loads 43a-43e). Since the measured state values usually map the actual operating state of the energy supply network 40 more reliably, they can be assigned a correspondingly higher weighting for the state estimation in relation to the computationally determined state values.

In a following step 24, the state values ascertained for the measuring points M1-M3 are supplied to the evaluation device. The latter checks by means of the state estimator whether a vector of state variables exists which can be specified by means of the model description and which matches the ascertained state values in an adequate manner. The state estimation itself can be carried out here for example using a weighted least-squares estimation method on the basis of the correspondingly weighted state values. A set of state variables is generated by means of the state estimation. At the same time the three-phase voltage phasors for the network nodes 41a-41g are estimated on the basis of the available state values. Thereafter the evaluation device performs a minimization of a cost function of the state estimation in which the state values are used as target variables. The cost function can assume the following form, for example:

$$J=[z-h(x)]^T R^{-1}[z-h(x)]$$

where
J: is the cost function
z: is the vector of the state values determined for the measuring points;
x: is the vector of the state variables
h(x): is the vector of the state equations for the model description of the energy supply network;
R: is the covariance matrix of the vector z;
$^T$: designates the transpose.

In this case the cost function can be minimized e.g. by means of an iterative Newton-Raphson method. In step 25, a check is made to determine whether the ascertained minimum of the cost function exceeds a predetermined threshold value. If this is not the case, the method is resumed at step 23 with the acquisition of further state values. If, on the other hand, the minimum of the cost function exceeds the threshold value, i.e. there exists no vector of state variables by means of which the operating state of the energy supply network 40 can be sufficiently accurately described, the evaluation device detects a fault in the energy supply network 40 and in a following step 26 outputs a fault detection signal.

In order to increase the reliability of the fault detection further, a further test value LNR can be determined in addition to the minimum of the cost function for the vectors of the state variables ascertained in the minimization of the cost function J in steps 24 and 25:

$$LNR = \max_i \frac{|z_i - h_i(\hat{x})|}{std(z_i - h(\hat{x}))},$$

where the index i stands for the state of the model description described by means of the i-th component of the measurement function h(x), i.e. the vector of the state equations of the model description of the energy supply system, and "std" signifies the standard deviation which is typically determined as a by-product of the state estimation. The fault detection signal can be generated by ANDing or ORing the results of the minimization of the cost function J and the calculation of the test value LNR. In an OR operation, the fault detection signal will be generated in step 26 even if only the cost function exceeds its threshold value or the test value LNR exceeds a selectable test threshold value; in an AND operation, both conditions must be present in order to generate the fault detection signal.

The output of the fault detection signal in step 26 terminates the fault detection phase 21b.

The presence of a fault detection signal causes the fault zone identification phase 21c to be started. In a first step 27 of said phase, the energy supply network 40 is logically subdivided into suitable subsections. The subsections should be specified in such a way that a redundancy of state values, preferably in respect of current measured values, exists at the boundaries of the respective subsection.

By way of example, the following three subsections are specified for the energy supply network 40: A first subsection 45a comprises network nodes 41a, 41b, 41c and 41d, since a redundancy of the voltage measurement exists for the network node 41b which connects the main line to the branch line. A second subsection 45b comprises the line between network nodes 41f and 41g as well as the network node 41g, since for this subsection 45b a redundancy exists by virtue of the measurement of the current flowing into the subsection 45b by means of the measuring device 44e. A third subsection 45c, finally, comprises the network nodes 41b, 41e and 41f.

For these three subsections 45a-45c or combinations of these subsections, largely the same method is performed as was applied already in the fault detection for the entire energy supply network 40, except that at network nodes bordering a subsection only state values in the form of voltages and currents flowing into the subsection are taken into account.

In a following step 28, the next subsection or a combination of subsections is therefore selected for investigation. In a next step 29, the state estimation for the subsection in question or the combination of subsections in question is thereupon carried out on the basis of the state values available for said subsection or said combination of subsections.

In actuality, for example, the first subsection 45a is selected for investigation in step 28 and the state estimation is carried out in step 29 for the first subsection 45a using the state values available herefor (current measurement at measuring point M1, voltage measurement at measuring points M1 and M2). In addition, a minimization of the cost function J already cited above is performed—though this time for the vector of state variables associated with the selected subsection or the selected combination of subsections. In order to increase the reliability of the outcome it is again possible also to calculate the test value LNR according to the above-cited equation—though this time for the selected subsection or the selected combination of subsections.

In step 30, a check is thereupon conducted to determine whether the result of the cost function J (or optionally the test value LNR) exceeds a predetermined threshold value (or test threshold value). If this is the case, then in the next step 31 the presence of a fault is stored for the subsection under consideration or the combination of subsections under consideration. In a following step 32, it is checked whether all of the available subsections or combinations of subsections have already been considered. If this is not the case, then the method execution sequence branches back to step 28 and the next subsection or the next combination of subsections is selected.

If, on the other hand, it is established in step 30 that the result of the cost function J (or optionally the test value LNR) lies below the threshold value (or the test threshold value), then the method is continued directly at step 32. Alternatively it is however possible in this case also to record a result entry in step 31, though this time in respect of the absence of a fault in the subsection under consideration or the combination of subsections under consideration.

In actuality, after the subsection 45a, for example, a first combination of the subsections 45a and 45b is checked in this manner, and thereafter a second combination of all three subsections 45a, 45b and 45c.

If, finally, the result of the query in step 32 is that all of the subsections or combinations of subsections specified in step 27 have been checked, the method is continued at step 33, in which the results of the checks are logically combined with one another in such a way that the actual fault-affected subsection can be identified. A fault zone signal which indicates the fault-affected subsection is additionally generated in step 33.

In actuality, the evaluation of the results of the checks in the case of the present exemplary embodiment can be performed for example as follows: If a fault is detected for the first subsection 45a, it is inferred that the fault lies in the first subsection 45a and a corresponding fault zone signal is output. In this case a check of the first combination (subsections 45a and 45b) and second combination (subsections 45a, 45b, 45c) can be dispensed with. If a fault-affected state is detected only for the first and the second combination, yet a fault-free state is established for the first subsection 45a, it is inferred that the fault lies in the third subsection 45c and a corresponding fault zone signal is output. Other logical combinations can easily be generated according to the respective network topology.

The fault zone identification phase 21c is terminated with step 33 and if a fault zone signal is present the method execution sequence is continued with step 34 in the fault localization phase.

In step 34, currents and voltages at at least one end of the fault-affected subsection are ascertained on the basis of the state estimations performed in the fault zone identification phase 21c for the fault-free subsections or combinations of subsections. In the following step 35 a—per se known—unilateral or bilateral fault location method is performed as a function of for how many ends of the fault-affected subsection said current and voltage information is present.

If, for example, it is assumed in actuality that the third subsection 45c has been identified as faulty in the fault zone identification phase 21c, then the voltage at the network node 41f and the current flowing from the network node 41f to the network node 41g are determined on the basis of the state estimation for the sound second subsection 45b. This means that current and voltage are present for the network node 41f forming one end of the fault-affected subsection 45c, and a unilateral fault location method can be performed in order to ascertain the exact location of the fault.

This fault location is finally output in step 36 as a fault location signal. The method execution sequence is thereby terminated and can be restarted at the fault detection phase 21b.

If the state estimation is already applied to one or more self-contained protection zones instead of being used for the entire energy supply network, then the result of the fault detection phase 21b already maps the result of the fault zone identification phase 21c, so that in this case the fault localization phase 21d follows on directly upon termination of the fault detection phase 21b.

The invention claimed is:

1. A method for detecting a fault in an electrical energy supply network, the method comprising:
   determining, with a respective intelligent electrical device (IED), state values for a plurality of measuring points in the energy supply network, the state values indicating an electrical state of the energy supply network at the respective measuring point;
   transmitting the state values from the IEDs to a centralized control center device via a communication bus, the control center device having an evaluation device; and
   using the state values by the evaluation device for detecting a fault that may be present in the energy supply network;
   performing a state estimation with the evaluation device, the state estimation making use of a model description of the electrical energy supply network that is suitable for describing possible electrical states of the energy supply network on the basis of state variables;
   carrying out a check by the evaluation device during the state estimation to determine whether the model description allows an electrical state of the energy supply network to be described which, in respect of the state variables used for the respective measuring points, at least approximately agrees with the respective state values; and
   absent such an electrical state, generating with the evaluation device a fault detection signal indicating a presence of a fault in the energy supply network.

2. The method according to claim 1, which comprises:
   performing the state estimation with the evaluation device for a delimited protection zone of the energy supply network;
   carrying out a check during the state estimation to determine whether the model description allows an electrical state of the protection zone to be described which, in respect of the state variables used for the respective measuring points lying in the protection zone, at least approximately agrees with the respective state values; and
   absent such a state, generating with the evaluation device the fault detection signal in the form of a fault zone signal indicating the presence of a fault in the protection zone.

3. The method according to claim 2, which comprises, if the fault zone signal is present for the protection zone affected by the fault, determining values for currents and voltages present at one or more ends of the protection zone and performing a calculation with the thus determined values for the currents and voltages to identify a location within the protection zone at which the fault occurred.

4. The method according to claim 1, which comprises:
   if the fault detection signal is present, dividing the energy supply network into a plurality of logical subsections;
   carrying out a check for individual subsections or combinations of subsections by way of a state estimation to determine whether an electrical state of the energy supply network can be described for the respective subsection or the combination of subsections with the model description, which state agrees in respect of the state variables used for the respective measuring points at least approximately with the respective state values; and
   absent such a state in respect of a specific subsection or a combination of subsections, generating with the evaluation device a fault zone signal indicating that subsection of the energy supply network for which the fault was detected.

5. The method according to claim 4, which comprises, if the fault zone signal is present for the subsection of the energy supply network affected by the fault, determining values for currents and voltages present at one or more ends of the subsection and performing a calculation with the thus determined values for currents and voltages to identify that location within the subsection at which the fault occurred.

6. The method according to claim 1, which comprises:
in order to check whether the model description allows an electrical state of the energy supply network to be described which, in respect of the state variables used for the respective measuring points, at least approximately agrees with the respective state values, minimizing with the evaluation device a cost function of states of the energy supply network which can be described by the model description; and
inferring an absence of a describable state if the result of the cost function lies above a selectable threshold value.

7. The method according to claim 6, which comprises using the following equation for the cost function:

$$J=[z-h(x)]^T R^{-1}[z-h(x)]$$

where
J: is the cost function;
z: is a vector of the state values determined for the measuring points;
x: is a vector of the state variables;
h(x): is a vector of the state equations for the model description of the energy supply network; and
R: is the covariance matrix of the vector z.

8. The method according to claim 7, which comprises determining a test value in addition by the evaluation device for a respective vector of the state variables emerging as a result from minimizing the cost function, according to $$LNR = \max_i \frac{|z_i - h_i(\hat{x})|}{std(z_i - h(\hat{x}))}$$

where the index i stands for the state of the model description described by way of an $i^{th}$ component of the vector of the state equations of the model description of the energy supply system; and
inferring an absence of a describable state when the test value exceeds a selectable test threshold value.

9. The method according to claim 1, which comprises calculating or estimating at least some of the state values for specific measuring points.

10. A control center device for detecting a fault in an electrical energy supply network, the control center device comprising:
an evaluation device for acquiring state values ascertained for a plurality of measuring points in the energy supply network, the state values indicating an electrical state of the energy supply network present at the respective measuring point;
said evaluation device being configured to perform the method according to claim 1 for detecting a fault that is present in the energy supply network on the basis of the state values.

11. An apparatus for detecting a fault in an electrical energy supply network, the apparatus comprising:
a plurality of intelligent electrical devices (IED) respectively disposed at a plurality of measuring points in the energy supply network, said IEDs being configured to determine state values indicating an electrical state of the energy supply network at the respective measuring points;
a centralized control center device disposed to receive the state values from the IED's via a communication bus, said control center device having an evaluation device;
said evaluation device being configured to use the state values for detecting a fault that may be present in the energy supply network, said evaluation device being configured for:
performing a state estimation making use of a model description of the electrical energy supply network that is suitable for describing possible electrical states of the energy supply network on the basis of state variables;
carrying out a check during the state estimation to determine whether the model description allows an electrical state of the energy supply network to be described which, in respect of the state variables used for the respective measuring points, at least approximately agrees with the respective state values; and
absent such an electrical state, generating a fault detection signal indicating a presence of a fault in the energy supply network.

12. The apparatus according to claim 11, wherein said evaluation device is configured for:
performing the state estimation for a delimited protection zone of the energy supply network;
carrying out a check during the state estimation to determine whether the model description allows an electrical state of the protection zone to be described which, in respect of the state variables used for the respective measuring points lying in the protection zone, at least approximately agrees with the respective state values; and
absent such a state, generating the fault detection signal in the form of a fault zone signal indicating the presence of a fault in the protection zone.

13. The apparatus according to claim 12, wherein, if the fault zone signal is present for the protection zone affected by the fault, values are determined for currents and voltages present at one or more ends of the protection zone and a calculation is performed with the thus determined values for the currents and voltages to identify a location within the protection zone at which the fault occurred.

14. The apparatus according to claim 11, wherein:
if the fault detection signal is present, dividing the energy supply network into a plurality of logical subsections;
the evaluation device carries out a check for individual subsections or combinations of subsections by way of a state estimation to determine whether an electrical state of the energy supply network can be described for the respective subsection or the combination of subsections with the model description, which state agrees in respect of the state variables used for the respective measuring points at least approximately with the respective state values; and
absent such a state in respect of a specific subsection or a combination of subsections, said evaluation device generates a fault zone signal indicating that subsection of the energy supply network for which the fault was detected.

15. The apparatus according to claim 14, wherein, if the fault zone signal is present for the subsection of the energy supply network affected by the fault, values are determined for currents and voltages present at one or more ends of the subsection and a calculation is performed with the thus determined values for currents and voltages to identify that location within the subsection at which the fault occurred.

16. The apparatus according to claim 11, wherein:

in order to check whether the model description allows an electrical state of the energy supply network to be described which, in respect of the state variables used for the respective measuring points, at least approximately agrees with the respective state values, said evaluation device is configured to minimize a cost function of states of the energy supply network which can be described by the model description; and an absence of a describable state is inferred if the result of the cost function lies above a threshold value.

17. The apparatus according to claim 16, wherein said evaluation device is configured to use the following equation for the cost function:

$$J=[z-h(x)]^T R^{-1}[z-h(x)]$$

where
- J: is the cost function;
- z: is a vector of the state values determined for the measuring points;
- x: is a vector of the state variables;
- h(x): is a vector of the state equations for the model description of the energy supply network; and
- R: is the covariance matrix of the vector z.

18. The apparatus according to claim 17, wherein said evaluation device is configured to additionally determine a test value for a respective vector of the state variables emerging as a result from minimizing the cost function, according to $$LNR = \max_i \frac{|z_i - h_i(\hat{x})|}{std(z_i - h(\hat{x}))}$$

where the index i stands for the state of the model description described by way of an $i^{th}$ component of the vector of the state equations of the model description of the energy supply system; and an absence of a describable state is inferred when the test value exceeds a selectable test threshold value.

19. The apparatus according to claim 11, wherein at least some of the state values for specific measuring points are calculated or estimated.

20. A control center device for detecting a fault in an electrical energy supply network, the control center device comprising:

an evaluation device for acquiring state values ascertained for a plurality of measuring points in the energy supply network, the state values indicating an electrical state of the energy supply network present at the respective measuring point;

said evaluation device being configured to perform the method according to claim 11 for detecting a fault that is present in the energy supply network on the basis of the state values.

* * * * *